United States Patent
Böhme

(10) Patent No.: US 11,212,614 B2
(45) Date of Patent: Dec. 28, 2021

(54) AUDIO SYSTEM AND METHOD FOR CONTROLLING AN AUDIO SYSTEM

(71) Applicant: Sennheiser electronic GmbH & Co. KG, Wedemark (DE)

(72) Inventor: Leif Böhme, Hannover (DE)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 0 days.

(21) Appl. No.: 16/861,461

(22) Filed: Apr. 29, 2020

(65) Prior Publication Data

US 2020/0351585 A1 Nov. 5, 2020

(30) Foreign Application Priority Data

Apr. 30, 2019 (DE) .......................... 102019111150.1

(51) Int. Cl.
*H04R 3/04* (2006.01)
*H03G 11/00* (2006.01)

(52) U.S. Cl.
CPC ............ *H04R 3/04* (2013.01); *H03G 11/002* (2013.01)

(58) Field of Classification Search
None
See application file for complete search history.

(56) References Cited

U.S. PATENT DOCUMENTS

| 2007/0121964 A1* | 5/2007 | Rumreich | H04R 3/14 381/99 |
| 2008/0205667 A1* | 8/2008 | Bharitkar | H04R 3/00 381/103 |
| 2016/0105742 A1* | 4/2016 | Gautama | H03G 3/20 381/99 |

* cited by examiner

*Primary Examiner* — James K Mooney
(74) *Attorney, Agent, or Firm* — Haug Partners LLP

(57) ABSTRACT

An audio system comprising a control circuit, at least one loudspeaker and at least one subwoofer for reproducing audio signals at low frequencies. The control circuit comprises an input connector and a bass management circuit that comprises a first filter with a low-pass for pre-filtering audio signals for the subwoofer and a second filter for pre-filtering audio signals for the loudspeaker. The loudspeaker comprises a high-pass filter, wherein in a transition frequency range of the amplitude responses of the first filter and the high-pass filter both filters raise or attenuate the audio signals such that the audio system overall, without considering the second filter, has a wavy amplitude response in the transition frequency range. The second filter however comprises at least one parametric filter that is adapted for flattening the amplitude response in the transition frequency range.

16 Claims, 5 Drawing Sheets

AUDIO SYSTEM AND METHOD FOR CONTROLLING AN AUDIO SYSTEM

CROSS-REFERENCE TO RELATED APPLICATIONS

This application claims benefit of foreign priority of German Patent Application No. 10 2019 111 150.1, filed on 30 Apr. 2019, the entirety of which is herein incorporated by reference.

FIELD OF DISCLOSURE

The present invention relates to an audio system and a method for controlling an audio system.

BACKGROUND

Audio systems, to which a plurality of loudspeakers and in particular subwoofers are connected, frequently use an integrated bass management. Herein, frequencies are separated between the subwoofer and the other loudspeakers. The audio signals to be reproduced by the loudspeakers are subjected to high-pass filtering, while those audio signals to be reproduced by the subwoofers are subjected to low-pass filtering. Thus, a spectrum of higher frequencies is reproduced by the loudspeakers, while a bass spectrum (that is, the spectrum with lower frequencies) can be reproduced by the subwoofer.

However, typically the loudspeakers that are to reproduce the higher frequencies have an integrated high-pass for eliminating the bass range (lower frequencies). Thus, the high-pass filtering in the audio system (i.e., a pre-filtering) may interact with the high-pass filtering in the loudspeaker, so that phase or amplitude problems may occur during reproduction of the audio signals through the loudspeakers.

FIG. 1 shows an amplitude response $A_S$ of a subwoofer, an amplitude response $A_L$ of a loudspeaker and the sum (i.e., superposition) $A_{Ad}$ of these two amplitude responses. The delay between subwoofer and loudspeaker was optimized for a best possible addition at 80 Hz. As can be seen in FIG. 1, a corresponding addition of the two signals leads to a waviness of more than $\pm 1$ $dB_{SPL}$ of the sum signal $A_{Ad}$, in particular in a range directly below and above 80 Hz, which is disadvantageous. In the example of FIG. 1, the loudspeaker has an acoustic high-pass of $6^{th}$ order at 60 Hz. This $6^{th}$ order high-pass may consist of a $4^{th}$ order high-pass of the bass reflex system and an electric high-pass of $2^{nd}$ order that protects the loudspeaker from excessive excursions at low frequencies. The subwoofer has a $4^{th}$ order high-pass at 17 Hz and a $4^{th}$ order low-pass at 1,200 Hz. FIG. 1 in particular shows that the transition range between the loudspeaker and the subwoofer is wavy and thus exhibits an undesired behavior. This may be attributed to a non-ideal amplitude response and phase response of the loudspeaker.

SUMMARY OF THE INVENTION

It is therefore an object of the present invention to avoid or at least reduce the disadvantages mentioned above. In particular, it is an object of the present invention to provide an audio system and a method for controlling an audio system that avoid phase and/or amplitude issues in reproduction through loudspeakers.

The invention relates to the idea of providing an audio system that has in its bass reflex system no high-pass filter in the loudspeaker's signal path, i.e., for the higher frequencies. Instead of a high-pass, one or more parametric filters may be used, such as bell filters for example (i.e., filters that have a bell-shaped frequency response around a center frequency). By avoiding an additional high-pass filter in the signal path for the (higher frequency) loudspeakers, phase and/or amplitude issues during reproduction of the audio signals may be avoided or at least significantly reduced. In particular, parametric filters are transparent at very low frequencies (e.g., below 20 Hz), so that no delay issues occur that would occur when using a high-pass filter.

Thus, embodiments of the invention relate to an audio system, having a control circuit, at least one loudspeaker, and at least one subwoofer for reproducing audio signals at low frequencies. The control circuit may comprise an input connector; a bass management circuit comprising a first filter for pre-filtering audio signals for the at least one subwoofer and a second filter for pre-filtering audio signals for the at least one loudspeaker; and an output with a first output connector for the at least one subwoofer and with a second output connector for the at least one loudspeaker. The first filter may comprise a low-pass with a first amplitude response. Also, the at least one loudspeaker may comprise a high-pass filter with a second amplitude response, in which there is a transition frequency range of the amplitude responses of the first filter and the high-pass filter in which both the first filter and the high-pass filter modify the audio signals by amplifying or attenuating. The second filter may comprise at least one parametric filter adapted for flattening a resulting amplitude response in the transition frequency range.

The second filter may comprise at least one parametric bell filter. In some embodiments, the second filter may comprise two or more parametric bell filters. In certain embodiments, the two or more parametric bell filters may have different center frequencies, and the center frequency of each parametric bell filter may be within the transition frequency range.

The second filter may have an amplitude response that is substantially transparent at a frequency where the first amplitude response has a maximum. Further, a resulting amplitude response of the audio system, without usage of the second filter, may have a waviness of at least $\pm 1$ dBSPL in the transition frequency range, and with usage of the second filter may have a waviness of less than $\pm 1$ dBSPL in the transition frequency range.

Embodiments of the invention also relate to a control circuit of an audio system comprising an input connector; a bass management circuit comprising a first filter for pre-filtering audio signals for at least one subwoofer and a second filter for pre-filtering audio signals for at least one loudspeaker; and an output with a first output connector for the at least one subwoofer and with a second output connector for the at least one loudspeaker. The first filter may comprise a low-pass with a first amplitude response, in which the at least one loudspeaker comprises a high-pass filter with a second amplitude response, and in which there is a transition frequency range of the first amplitude response of the first filter and the second amplitude response of the high-pass filter in which both the first filter and the high-pass filter modify the audio signals by attenuating or amplifying. The second filter may comprise at least one parametric filter that is adapted at least to the second amplitude response of the high-pass filter and that flattens a resulting amplitude response in the transition frequency range.

In some embodiments, the second filter may comprise two or more parametric filters. In certain embodiments, the two or more parametric filters may have different center frequencies, and the center frequency of each of the parametric filter may be within the transition frequency range.

In some embodiments, the second filter may have an amplitude response that is substantially transparent at a frequency where the first amplitude response has a maximum.

In some embodiments, at least one of the parametric filters is a bell filter.

Further, in some embodiments, the resulting amplitude response may result from a superposition of the first filter and a serial connection of the second filter and the high-pass filter, in which the resulting amplitude response may comprise an overall waviness of less than ±1 $dB_{SPL}$ in the transition frequency range.

Embodiments of the invention also relate to a method for controlling an audio system comprising a control circuit, at least one loudspeaker with a high-pass filter, and at least one subwoofer for reproducing audio signals at low frequencies, in which the control circuit comprises a bass management circuit. The method comprises, in the bass management circuit, pre-filtering audio signals for the at least one subwoofer in a first filter, and pre-filtering audio signals for the at least one loudspeaker in a second filter. The first filter may comprise a low-pass and may have a first amplitude response, in which the high-pass filter has a second amplitude response. In a transition frequency range of the amplitude responses of the first filter and the high-pass filter, both filters may modify the audio signals by attenuating or raising. Also, the second filter may comprise at least one parametric filter adapted for flattening a resulting amplitude response in the transition frequency range.

The second filter may comprise at least one parametric bell filter. In some embodiments, the second filter may comprise two or more parametric filters. In certain embodiments, the two or more parametric filters may have different center frequencies, and the center frequencies of each of the parametric filters may be within the transition frequency range.

The second filter may have an amplitude response that is substantially transparent at a frequency where the first amplitude response has a maximum.

Also, an overall amplitude response of the audio system may have a waviness of less than ±1 $dB_{SPL}$ in the transition frequency range.

Further embodiments of the invention are disclosed in the following description and are subject of the dependent claims.

BRIEF DESCRIPTION OF THE DRAWINGS

Advantages and embodiments of the invention are disclosed in the following with reference to the drawings.

DETAILED DESCRIPTION OF PREFERRED EMBODIMENTS

Figure 2:
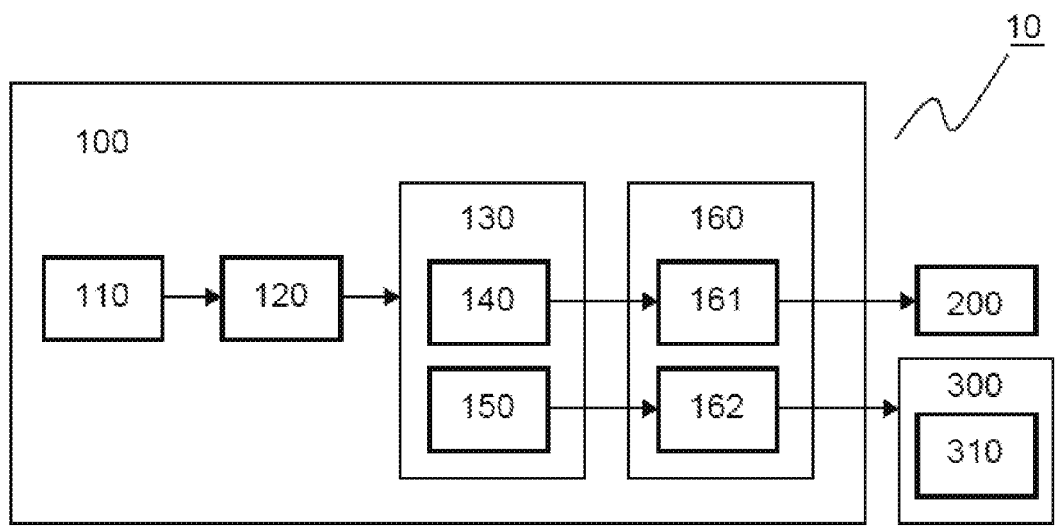
FIG. 2 shows a schematic block diagram of an audio system according to a first embodiment.

FIG. 2 shows a block diagram of an audio system according to a first embodiment. The audio system 10 has a control unit 100, such as for example a control circuit, at least one (sub-)woofer 200 and at least one loudspeaker 300. The control unit 100 has at least one input connector 110 for receiving an audio signal to be reproduced, an amplifier 120, and a bass management circuit 130 with a first filter 140 and with a second electric or electronic filter 150 or corresponding filtering unit. The control unit 100 further has output connectors 160, in particular a first output connector 161 for at least one subwoofer 200 and at least one second output connector 162 for at least one loudspeaker 300. The at least one loudspeaker 300 comprises a high-pass filter 310. The loudspeaker 300 could be, e.g., a KH80 manufactured by Georg Neumann GmbH. In one embodiment, the control unit 100 may be integrated into the subwoofer 200, so that the loudspeaker 300 is connected to the subwoofer 200. This has an advantage in that characteristics of the subwoofer are known. The importance of these characteristics is explained further below.

The signal to be reproduced is received at the input connector 110. Then the signal is amplified in the amplifier 120 and subsequently filtered in the bass management circuit 130. Alternatively, the signal is first filtered in the bass management circuit 130 and subsequently amplified in the amplifier 120. In the bass management circuit or unit 130, a pre-filtering is performed. For this, a low-pass filter 140 is comprised. The output of the low-pass filter 140 is then provided through the first output connector 161 to a subwoofer 200. Further, in the bass management circuit 130 there is at least one electric or electronic filter 150 or filtering unit 150 that performs the pre-filtering for the loudspeaker or loudspeakers.

While conventionally a high-pass filter is used here, one or more parametric filters, in particular bell filters in one embodiment, are used according to the invention. This type of filter is, unlike a high-pass filter, transparent for low frequencies (e.g. below 20 Hz). In many embodiments, bell filters have an amplitude response that is substantially symmetric. The fact that a high-pass filter is no longer used for pre-filtering the loudspeaker signal can avoid or at least reduce phase and/or amplitude problems in the acoustic superposition or addition of the output signals of the subwoofer and the loudspeaker.

The filter 150, or filtering unit 150, respectively, is individually adapted at least for the loudspeaker or the high-pass filter 310 comprised in the loudspeaker 300. However, it may also be adapted to the subwoofer 200. It may comprise a plurality of individual filters and may be implemented by hardware elements, such as, e.g., one or more processors and software for controlling the processors. The bass management circuit 130 may comprise electronic hardware components for analog and/or digital processing. It may also comprise one or more Analog-to Digital (AD)-converters and/or Digital-to-Analog (DA)-converters. If a plurality of loudspeakers are to be connected to the audio system 10, the filter or filtering unit 150 needs to be individually adapted for each of them, since different loudspeakers 300 usually comprise individually different filters 310. Correspondingly, a separate filter or filtering unit 150 for each loudspeaker to be connected is provided in the bass management unit 130 in this case. If a plurality of equal loudspeakers 300 are to be connected to the audio system 10, it may be possible for them to use the same filter or filtering unit 150.

Figure 1:
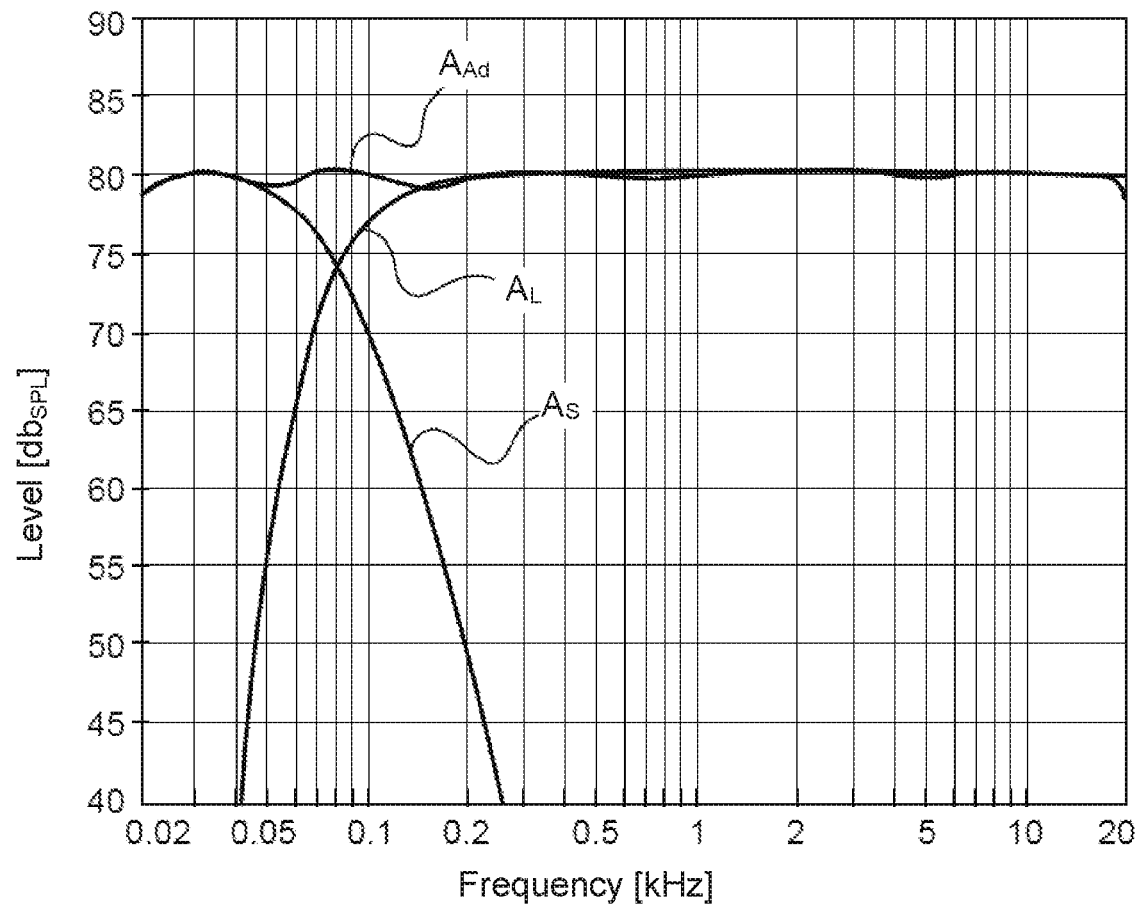
FIG. 1 shows a graph of an amplitude response of a loudspeaker and a subwoofer in a prior art audio system.
Figure 3:
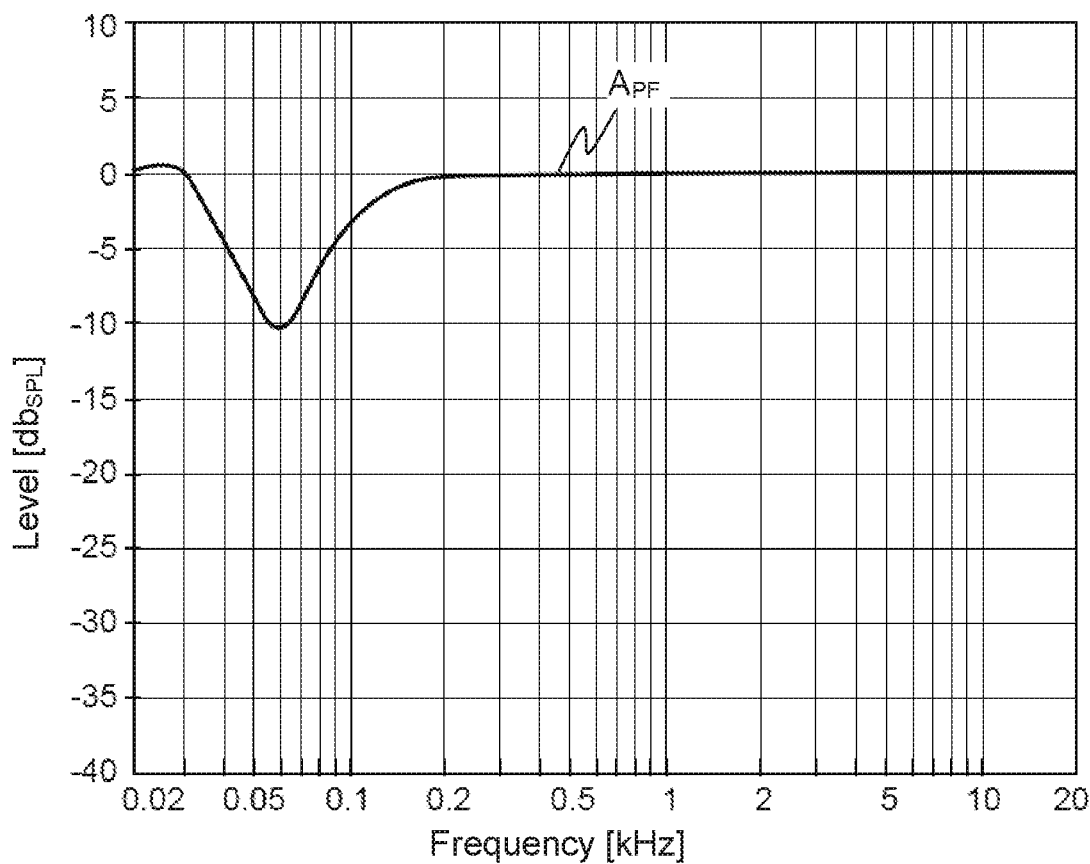
FIG. 3 shows a graph of an amplitude response of a filter in an audio system, according to an embodiment.

FIG. 3 shows a graph of an amplitude response $A_{PF}$ of a filter of an audio system, according to a first embodiment. In particular, the electrical filtering is carried out by three bell filters here. As shown in FIG. 3, their center frequencies differ from each other and are within the transition range, or are at least close to the transition range. Further, it is important that the amplitude response $A_{PF}$ is transparent (i.e., 0 dB), or at least substantially transparent (e.g., within ±1 dB), for frequencies at which the amplitude response $A_S$ of the low-pass has a maximum, e.g., 30 Hz. In the example, the center frequencies of two bell filters are within the transition range and the center frequency of the third bell filter is close to the transition range. For example, a first bell filter has a minimum of −11.5 dB at 59 Hz (Q=2.1), a second bell filter has a maximum of 3 dB at 28 Hz (Q=2.0) and a third bell filter has a maximum of 1.6 dB at 115 Hz (Q=0.9). Thus, FIG. 3 shows a pre-filtering curve for the loudspeaker 300. The pre-filtering is adapted to the amplitude responses $A_S$, $A_L$ of the subwoofer 200 and the loudspeaker 300 as shown in FIG. 1. The filtering is particularly effective in a transition range of the amplitude responses of the first filter 140 and the high-pass filter 310. In this range, a conventional audio system has an overall wavy amplitude response. This waviness is substantially reduced by the pre-filtering according to the invention.

Figure 4:
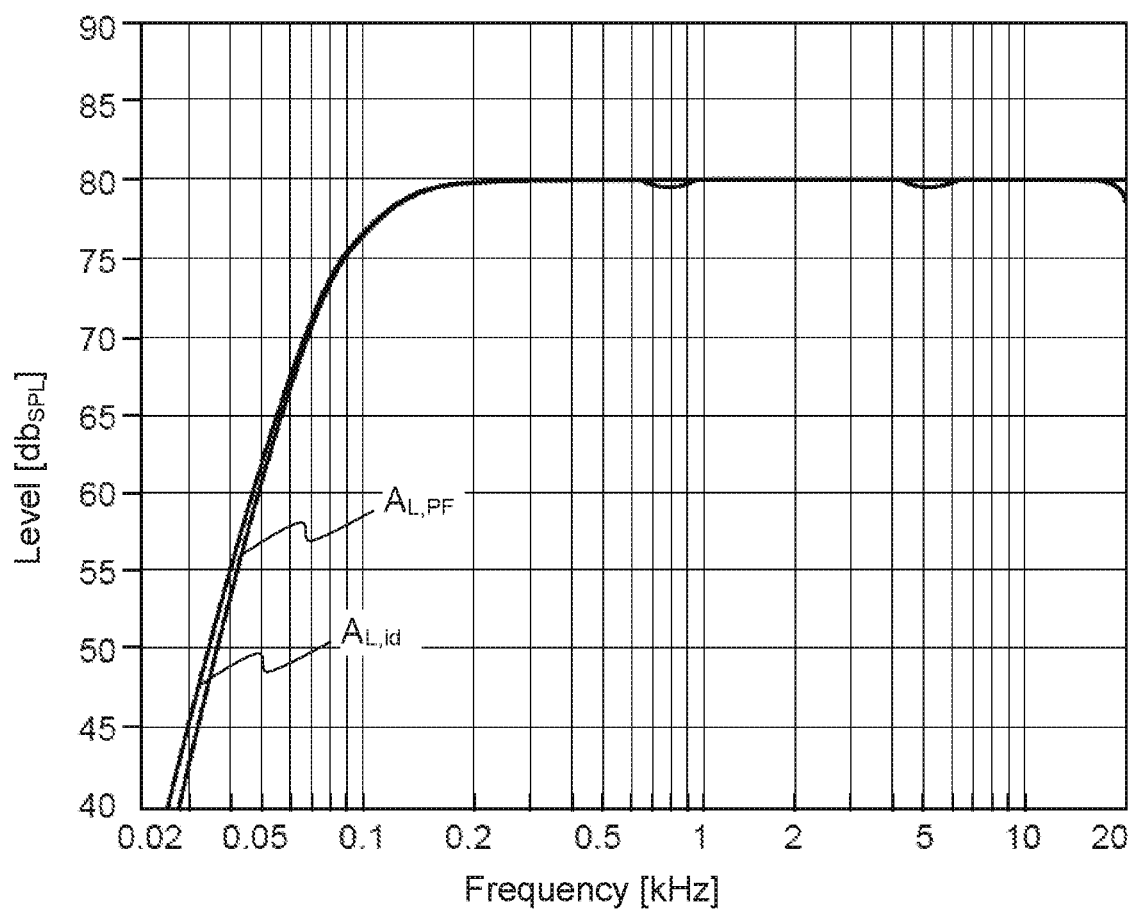
FIG. 4 shows a graph of an amplitude response of a loudspeaker that was subjected to filtering.

FIG. 4 shows a graph of an amplitude response $A_{L,PF}$ of a loudspeaker that has been filtered according to the invention. Thus, FIG. 4 shows an application of the filtering of FIG. 3 to a loudspeaker 300. The amplitude curve $A_{L,PF}$ essentially corresponds here to an ideal amplitude curve $A_{L,id}$ of the loudspeaker, i.e., an amplitude curve that would be desired as ideal.

Figure 5:
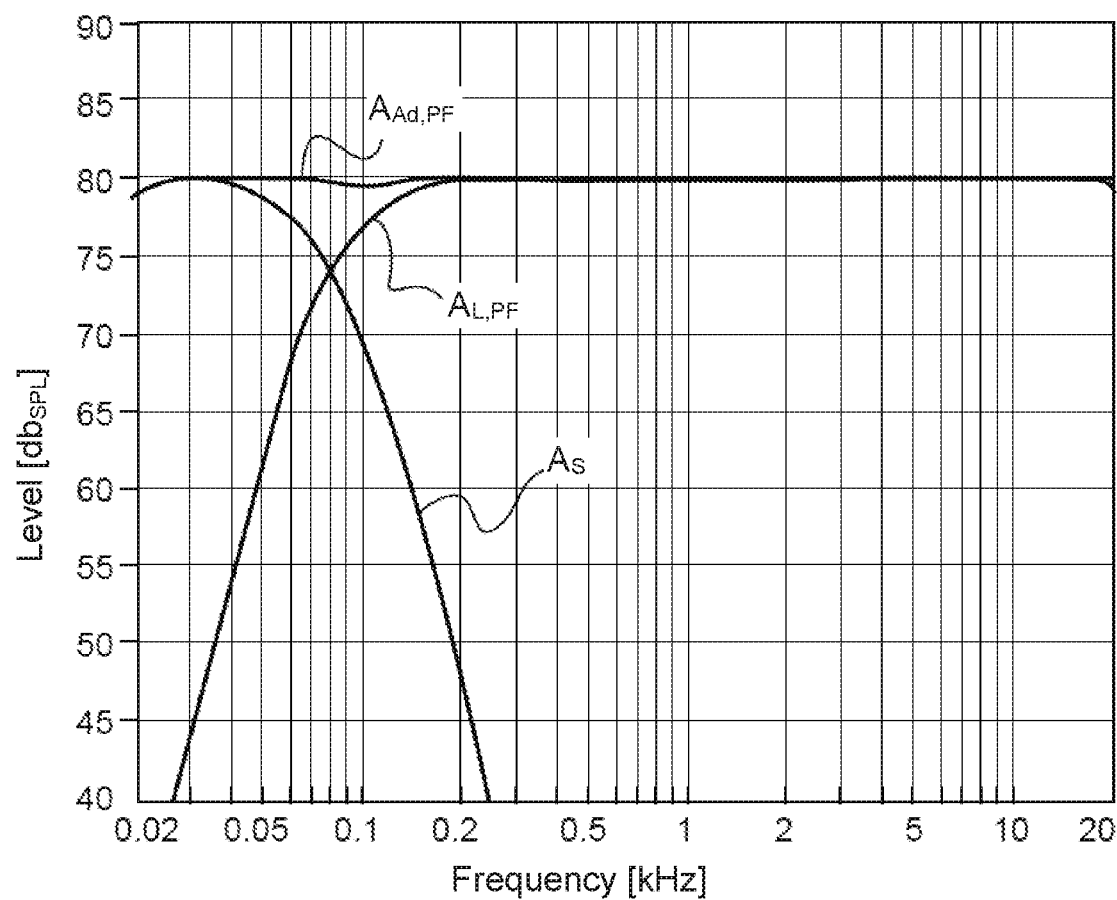
FIG. 5 shows a graph of an amplitude response of a subwoofer, a loudspeaker and an addition of these signals with a correction according to the invention.

In FIG. 5, an amplitude response $A_S$ of the subwoofer and a pre-filtered (i.e., corrected) amplitude response $A_{L,PF}$ of the loudspeaker as well as the addition $A_{Ad,PF}$ of these two amplitude responses is shown. In particular, the pre-filtering effect of a filter 150 that comprises a plurality of parametric bell filters is shown. By the pre-filtering according to the invention, which is performed in the control unit 100, an almost ideal addition is achieved, since the resulting amplitude response $A_{Ad,PF}$ is almost constant. The waviness of the resulting amplitude response $A_{Ad,PF}$, i.e., the deviation from a target value which is around 80 $dB_{SPL}$ here, is clearly below ±1 $dB_{SPL}$, e.g. at ±0.2 $dB_{SPL}$.

Figure 6:
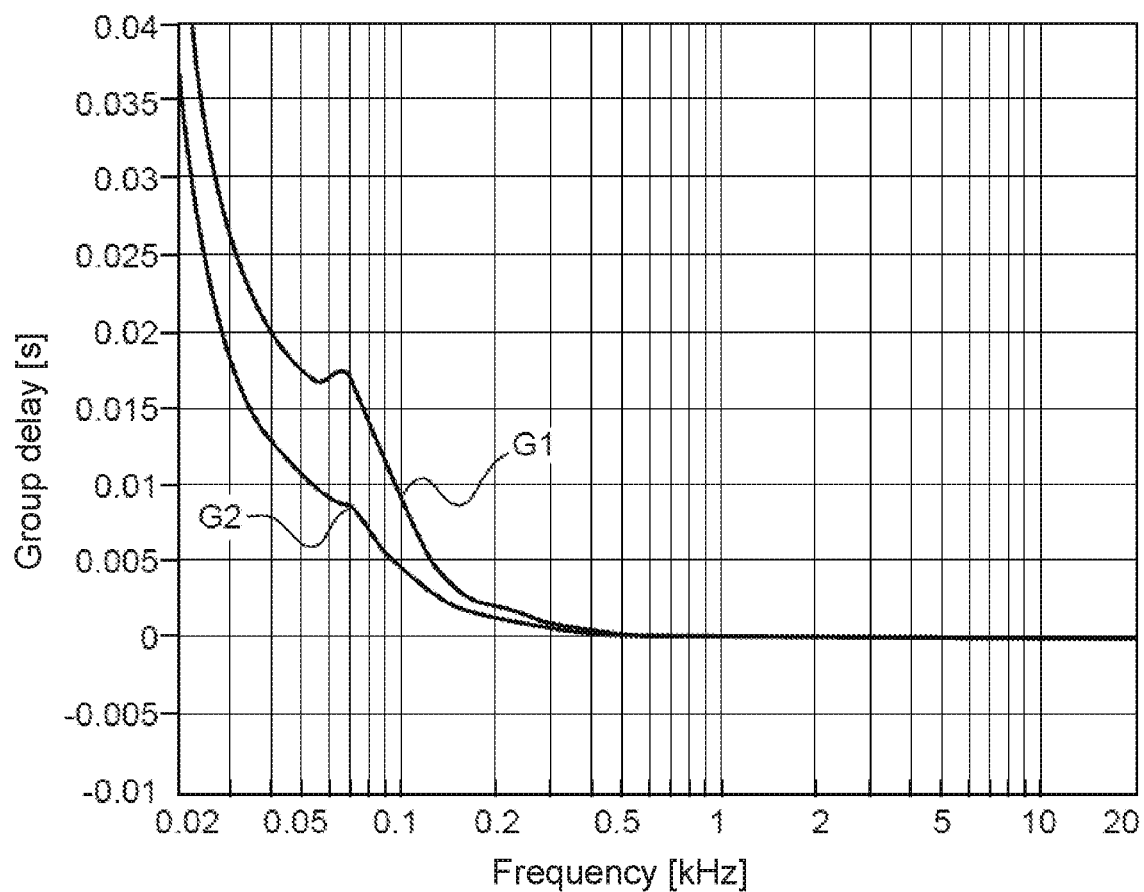
FIG. 6 shows a graph of a group delay of the signals.

The pre-filtering according to the invention is advantageous not only for the amplitude curve, but also for the phase curve and thus the group delay, which depends on the phase curve. FIG. 6 shows a graph of a group delay of the signals. In FIG. 6, the group delay G1 of a conventional solution and the group delay G2 resulting from the pre-filtering according to the invention is depicted. As can be seen, the pre-filtering according to the invention reduces the group delay particularly in a frequency range below 100 Hz, or between 20 Hz and 100 Hz respectively, by up to 10 ms. This creates an audible improvement, or eliminates audible distortions respectively.

Figure 7:
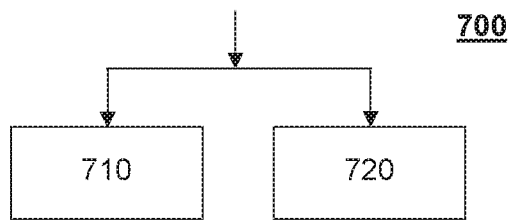
FIG. 7 shows a flow-chart of a method for controlling an audio system.

In one embodiment, the invention relates to a method for controlling an audio system. FIG. 7 shows a flow-chart of a method 700 for controlling an audio system comprising a control unit with a bass management unit, at least one loudspeaker with a high-pass filter and at least one woofer or subwoofer for reproducing audio signals at low frequencies. The method 700 comprises the steps of pre-filtering 710 audio signals for the at least one woofer or subwoofer by a first filter 140 in the bass management unit, and pre-filtering 720 audio signals for the at least one loudspeaker by a second filter 150 in the bass management unit, wherein the first filter comprises a low-pass. In a transition frequency range of the amplitude responses of the first filter and the high-pass filter, both filters modify the audio signals by amplifying or attenuating. The second filter comprises at least one parametric filter that flattens the amplitude response in the transition frequency range. As indicated in FIG. 7, the two steps 710, 720 are usually performed simultaneously. In further embodiments, the method may correspond to the embodiments relating to an audio system as described above.

The invention claimed is:

1. An audio system, having
   (a) a control circuit,
   (b) at least one loudspeaker, and
   (c) at least one subwoofer for reproducing audio signals at low frequencies,
   wherein the control circuit comprises:
      (i) an input connector,
      (ii) a bass management circuit comprising a first filter for pre-filtering audio signals for the at least one subwoofer and a second filter for pre-filtering audio signals for the at least one loudspeaker, and
      (iii) an output with a first output connector for the at least one subwoofer and with a second output connector for the at least one loudspeaker,
   wherein the first filter comprises a low-pass with a first amplitude response,
   wherein the at least one loudspeaker comprises a high-pass filter with a second amplitude response, and wherein there is a transition frequency range of the amplitude responses of the first filter and the high-pass filter in which both the first filter and the high-pass filter modify the audio signals by amplifying or attenuating,
   and wherein the second filter comprises at least two parametric filters adapted for flattening a resulting amplitude response in the transition frequency range, the at least two parametric filters having different center frequencies within the transition frequency range.

2. The audio system according to claim 1, wherein the second filter comprises at least one parametric bell filter.

3. The audio system according to claim 1, wherein the second filter has an amplitude response that is substantially transparent at a frequency where the first amplitude response has a maximum.

4. The audio system according to claim 1, wherein a resulting amplitude response of the audio system, without usage of the second filter, has a waviness of at least ±1 $dB_{SPL}$ in the transition frequency range, and with usage of the second filter has a waviness of less than ±1 $dB_{SPL}$ in the transition frequency range.

5. A control circuit for an audio system, comprising
   (a) an input connector,
   (b) a bass management circuit comprising a first filter for pre-filtering audio signals for at least one subwoofer and a second filter for pre-filtering audio signals for at least one loudspeaker, and
   (c) an output with a first output connector for the at least one subwoofer and with a second output connector for the at least one loudspeaker,
   wherein the first filter comprises a low-pass with a first amplitude response, and wherein the at least one loudspeaker comprises a high-pass filter with a second amplitude response, wherein there is a transition frequency range of the first amplitude response of the first filter and the second amplitude response of the high-pass filter in which both the first filter and the high-pass filter modify the audio signals by attenuating or amplifying, and wherein the second filter comprises at least two parametric filters that have different center frequencies within the transition frequency range and that are adapted at least to the second amplitude response of the high-pass filter and that flatten a resulting amplitude response in the transition frequency range.

6. The control circuit according to claim 5, wherein the second filter has an amplitude response that is substantially transparent at a frequency where the first amplitude response has a maximum.

7. The control circuit according to claim 5, wherein at least one of the parametric filters is a bell filter.

8. The control circuit according to claim 5, wherein the resulting amplitude response results from a superposition of the first filter and a serial connection of the second filter and the high-pass filter, and wherein the resulting amplitude response comprises an overall waviness of less than ±1 $dB_{SPL}$ in the transition frequency range.

9. A method for controlling an audio system comprising a control circuit, at least one loudspeaker with a high-pass filter, and at least one subwoofer for reproducing audio signals at low frequencies, wherein the control circuit comprises a bass management circuit, and wherein the method comprises the following steps:
   in the bass management circuit, pre-filtering audio signals for the at least one subwoofer in a first filter and pre-filtering audio signals for the at least one loudspeaker in a second filter,
   wherein the first filter comprises a low-pass and has a first amplitude response and wherein the high-pass filter has a second amplitude response,
   wherein, in a transition frequency range of the amplitude responses of the first filter and the high-pass filter, both filters modify the audio signals by attenuating or raising,
   wherein the second filter comprises at least one parametric filter adapted for flattening a resulting amplitude response in the transition frequency range, and
   wherein an overall amplitude response of the audio system has a waviness of less than ±1 $dB_{SPL}$ in the transition frequency range.

10. The method according to claim 9, wherein the second filter comprises at least one parametric bell filter.

11. The method according to claim 9, wherein the second filter comprises two or more parametric filters.

12. The method according to claim 11, wherein the two or more parametric filters have different center frequencies, and the center frequencies of each of the parametric filters are within the transition frequency range.

13. The method according to claim 9, wherein the second filter has an amplitude response that is substantially transparent at a frequency where the first amplitude response has a maximum.

14. An audio system, having
(a) a control circuit,
(b) at least one loudspeaker, and
(c) at least one subwoofer for reproducing audio signals at low frequencies,
wherein the control circuit comprises:
   (i) an input connector,
   (ii) a bass management circuit comprising a first filter for pre-filtering audio signals for the at least one subwoofer and a second filter for pre-filtering audio signals for the at least one loudspeaker, and
   (iii) an output with a first output connector for the at least one subwoofer and with a second output connector for the at least one loudspeaker,
wherein the first filter comprises a low-pass with a first amplitude response,
wherein the at least one loudspeaker comprises a high-pass filter with a second amplitude response, and wherein there is a transition frequency range of the amplitude responses of the first filter and the high-pass filter in which both, the first filter and the high-pass filter, modify the audio signals by amplifying or attenuating,
wherein the second filter comprises at least one parametric filter adapted for flattening a resulting amplitude response in the transition frequency range,
and wherein the second filter has an amplitude response that is substantially transparent at a frequency where the first amplitude response has a maximum.

15. An audio system, having
(a) a control circuit,
(b) at least one loudspeaker, and
(c) at least one subwoofer for reproducing audio signals at low frequencies,
wherein the control circuit comprises:
   (i) an input connector,
   (ii) a bass management circuit comprising a first filter for pre-filtering audio signals for the at least one subwoofer and a second filter for pre-filtering audio signals for the at least one loudspeaker, and
   (iii) an output with a first output connector for the at least one subwoofer and with a second output connector for the at least one loudspeaker,
wherein the first filter comprises a low-pass with a first amplitude response,
wherein the at least one loudspeaker comprises a high-pass filter with a second amplitude response, and wherein there is a transition frequency range of the amplitude responses of the first filter and the high-pass filter in which both, the first filter and the high-pass filter, modify the audio signals by amplifying or attenuating,
wherein the second filter comprises at least one parametric filter adapted for flattening a resulting amplitude response in the transition frequency range,
and wherein a resulting amplitude response of the audio system, without usage of the second filter, has a waviness of at least ±1 $dB_{SPL}$ in the transition frequency range, and with usage of the second filter has a waviness of less than ±1 $dB_{SPL}$ in the transition frequency range.

16. A control circuit for an audio system, comprising
(a) an input connector,
(b) a bass management circuit comprising a first filter for pre-filtering audio signals for at least one subwoofer and a second filter for pre-filtering audio signals for at least one loudspeaker, and
(c) an output with a first output connector for the at least one subwoofer and with a second output connector for the at least one loudspeaker,
wherein the first filter comprises a low-pass with a first amplitude response, and wherein the at least one loudspeaker comprises a high-pass filter with a second amplitude response, wherein there is a transition frequency range of the first amplitude response of the first filter and the second amplitude response of the high-pass filter in which both, the first filter and the high-pass filter, modify the audio signals by attenuating or amplifying, wherein the second filter comprises at least one parametric filter that is adapted at least to the second amplitude response of the high-pass filter and that flattens a resulting amplitude response in the transition frequency range, and wherein the second filter has an amplitude response that is substantially transparent at a frequency where the first amplitude response has a maximum.

* * * * *